(12) United States Patent
Kaminski (10) Patent No.: US 9,662,918 B2
(45) Date of Patent: May 30, 2017

(54) GRADIENT INK CONTAINMENT PRINTING PROCESS AND APPARATUS

(71) Applicant: E I DU PONT DE NEMOURS AND COMPANY, Wilmington, DE (US)

(72) Inventor: Jann Paul Kaminski, Santa Barbara, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 54 days.

(21) Appl. No.: 14/678,240

(22) Filed: Apr. 3, 2015

(65) Prior Publication Data
US 2016/0288526 A1    Oct. 6, 2016

(51) Int. Cl.
*B41J 29/393* (2006.01)
*B41J 2/19* (2006.01)
*H01L 51/00* (2006.01)

(52) U.S. Cl.
CPC ............... *B41J 29/393* (2013.01); *B41J 2/19* (2013.01); *H01L 51/0005* (2013.01); *B41J 2029/3935* (2013.01)

(58) Field of Classification Search
CPC ............................ B41J 2/195; H01L 51/0005
See application file for complete search history.

(56) References Cited

U.S. PATENT DOCUMENTS 6,670,645 B2    12/2003  Grushin et al.

FOREIGN PATENT DOCUMENTS

| WO | 03/008424 A1 | 1/2003 |
|----|--------------|--------|
| WO | 03/040257 A1 | 5/2003 |
| WO | 03/063555 A1 | 7/2003 |
| WO | 03/091688 A2 | 11/2003 |
| WO | 2004/016710 A1 | 2/2004 |

*Primary Examiner* — Bradley Thies (57) ABSTRACT

A printing operation using a gradient ink containment structure to test wetting characteristics of printing compositions. The gradient ink containment structures are arranged in columns with gaps between adjacent structures. These gaps may increase when progressing through the column of gradient ink containment structures. The top surfaces of the gradient ink containment structures define geometric shapes that may vary in area when progressing through the column of gradient ink containment structures.

10 Claims, 5 Drawing Sheets

GRADIENT INK CONTAINMENT PRINTING PROCESS AND APPARATUS

BACKGROUND OF THE INVENTION

Field of the Invention

This invention relates to a printing process and apparatus for testing deposition of liquid compositions on a surface. In particular, depositing liquid compositions on a proofing device containing a gradient of ink containment structures arranged in columns and having gaps between adjacent ink containment structures. The gaps can be constant or increase in magnitude when progressing through the column of ink containment structures. The gradient in gaps, print areas, and shape of the top surface allows evaluation of printing ink liquid compositions, as well as properties of the top surfaces. This proofing device promotes rapid evaluation of wetting characteristics on the top surface of the ink containment structures.

Description of the Related Art

An electronic device can include a liquid crystal display ("LCD"), an organic light-emitting diode (OLED) display, or the like. The manufacture of electronic devices may be performed using solution deposition techniques, or alternatively, vapor phase techniques. For solution deposition, one process of making electronic devices is to deposit organic layers over a substrate, also referred to as a backplane when containing electronic elements, by printing (e.g., ink-jet printing, continuous printing, etc.). In a printing process, the liquid composition, also called ink, being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

The OLED devices produced by such processes utilize one or more layers of organic semiconductor materials laminated with other supporting layers, and sandwiched by two electrodes, these devices are used in many different kinds of electronic equipment.

Several methods for providing ink containment for OLED devices are described in the literature. These are based on containment structures, surface tension discontinuities, and combinations of both. The testing of new inks, or new formulations upon which the ink is deposited, is an expensive procedure when using operational backplanes containing requisite electronic elements. In addition, variables such as pixel area, pixel shape, and linear separation between pixels is not accommodated when employing existing backplanes.

In addition, surface tension discontinuities are obtained when there are either printed or vapor deposited regions of low surface tension materials. These low surface tension materials generally must be applied before printing or coating the first organic active layer in the pixel area. Generally the use of these treatments impacts the quality when coating continuous non-emissive layers, so all the layers must be printed.

Each organic semiconductor material can be carried in a liquid composition. During manufacture of a device each liquid composition is dispensed from a dedicated nozzle assembly. The nozzle assemblies are grouped in nozzle sets, with one nozzle in each set dispensing a particular color of ink. Each nozzle assembly dispenses liquid and deposits that liquid along a longitudinal lane that extends across a backplane of the device. The nozzle assemblies in each nozzle set dispense a liquid composition into a respective lane. The nozzle assemblies can be located within a printhead, and the printhead travels in a linear path in a first or forward direction, in addition to a second or reverse direction, while printing the liquid composition on the backplane.

Liquid printing can be conducted in either non-continuous or continuous operation as disclosed in the prior art. The deposition of the liquid composition in a continuous operation leads to a portion of the liquid composition being deposited outside the bounds of the substrate, or between active pixel areas of the electronic device, and this portion is either recycled or lost. Closer spacing between adjacent pixels leads to higher resolution of resulting displays, as referenced by the PPI (pixels-per-inch) designation of modern display units. This requirement for ever higher PPI designs requires tighter control for liquid deposition. In particular, the ink must "break" cleanly during deposition to fully cover the desired print area without forming a bridge to the neighboring print areas.

Non-continuous, or discrete liquid deposition, include various methods used in digital printing including: ink-jet; continuous ink-jet (CU); drop-on-demand (DOD), using thermal or piezoelectric DOD. Continuous liquid deposition can include nozzle or slot die coaters among several choices where a continuous stream of ink is emitted, but only discrete areas are intended to capture the ink.

In other words, any adjustment to the ink formulation, or to compositions defining the top layer of the print areas, requires testing and optimization of the printing process. This optimization can be time consuming and expensive to conduct. Accordingly, any printing process changes made for production level manufacturing can result in pixels containing too little or too much ink. This is a continuing problem, and the testing solutions have not met the required level of time and cost levels required for printing of organic electronic devices. In view of the foregoing it is believed additional improvement is required to optimize print processing for organic electronic devices.

SUMMARY OF THE INVENTION

The presently claimed invention is directed to a proofing device comprising:
- a substrate;
- a plurality of first geometric shapes in column arrangement on the substrate, the first geometric shapes with first gaps between adjacent first geometric shapes, the first geometric shapes having a height h1 above the substrate;
- a plurality of second geometric shapes in column arrangement on the substrate, the second geometric shapes with second gaps between adjacent second geometric shapes, the second geometric shapes having a height h2 above the substrate; and
- a top layer on each of the first and second geometric shapes, wherein at least one of the first and second gaps increases in progressing through the plurality of the first or second geometric shapes.

In one embodiment the top layers increase in area in progressing through the plurality of the first and/or second geometric shapes.

In one embodiment at least one of the top layers of the first and second geometric shapes comprises a peripheral area having a first surface energy and an interior area having a second surface energy, the first and second surface energy are distinct from one another. This top layer arrangement of the peripheral area and the interior area can be applied to some or all of the of the first geometric shapes, and some or all of the second geometric shapes.

In one embodiment the interior area of the top layer can be an organic material. This organic material can be selected from one or more of a semiconductor primer, a hole transport material, and an electroluminescent material.

In one embodiment the first and second geometric shapes are selected from circles, ellipses, and rectangles.

In one embodiment the height h1 of the first geometric shapes can be equal to the height h2 of the second geometric shapes.

In one embodiment the height h1 of the first geometric shapes can be different from the height h2 of the second geometric shapes.

The presently claimed invention is also directed to a printing process comprising:

providing a substrate surface having a plurality of first geometric shapes in column arrangement and a plurality of second geometric shapes in column arrangement, wherein the first geometric shapes with first gaps between adjacent first geometric shapes and the second geometric shapes with second gaps between adjacent second geometric shapes, wherein at least one of the first and second gaps increases in progressing through the plurality of the first or second geometric shapes;

providing a top layer on each of the first and second geometric shapes;

printing an organic composition on the top layer of each of the first and second geometric shapes; and measuring wetting results for all of the organic composition on the top layer of each of the first and second geometric shapes.

In one embodiment the wetting results are for interior areas of each top layer.

In one embodiment the printing is continuous printing, where the continuous printer may be selected from slot-die coating or nozzle printing.

In one embodiment the printing is non-continuous printing, where the non-continuous printer may be selected from ink-jet printing.

BRIEF DESCRIPTION OF THE DRAWINGS

The invention will be more fully understood from the following detailed description, taken in connection with the accompanying drawings, which form a part of this application and in which.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION OF THE INVENTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims.

Definitions and Clarification of Terms

Before addressing details of embodiments described below, some terms are defined or clarified.

The term "discrete" is intended to mean consisting of distinct or unconnected elements.

The term "electroluminescent" or "electroactive" when referring to a layer or material, is intended to mean a layer or material that exhibits electronic or electro-radiative properties. In an electronic device, an electroactive material electronically facilitates the operation of the device. Examples of electroactive materials include, but are not limited to, materials which conduct, inject, transport, or block a charge, where the charge can be either negative (an electron) or positive (a hole), and materials which emit radiation or exhibit a change in concentration of electron-hole pairs when receiving radiation. Examples of inactive materials include, but are not limited to, insulating materials and environmental barrier materials.

The term "electronic device" or sometimes "organic electronic device" is intended to mean a device including one or more organic semiconductor layers or materials.

The term "electron transport" or "electron injection" means, when referring to a layer, material, member or structure, such a layer, material, member or structure that promotes or facilitates migration of negative charges through such a layer, material, member or structure into another layer, material, member or structure.

The term "gap" or "gaps" in intended to mean linear distance between selected elements.

The term "geometric shapes" means utilizing rectilinear or simple curvilinear motifs or outlines in defining a shape or surface of an object.

The term "hole injecting" is synonymous with "electron withdrawing." Literally, holes represent a lack of electrons and are typically formed by removing electrons, thereby creating an illusion that positive charge carriers, called holes, are being created or injected. The holes migrate by a shift of electrons, so that an area with a lack of electrons is filled with electrons from an adjacent layer, which give the appearance that the holes are moving to that adjacent area. For simplicity, the terms holes, hole injecting, hole transport, and their variants will be used.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "ink" is used to describe a liquid for printing, where the liquid can be a solution, dispersion, suspension, or emulsion.

The term "liquid" is intended to include single liquid materials, combinations of liquid materials, and these may be solutions, dispersions, suspensions, or emulsions.

The term "organic" is intended to mean the class of chemical compounds having a carbon basis.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels. A sensor array can include pixels that may or may not include subpixels.

The term "printing" is intended to mean an act of selectively depositing a layer by dispensing a liquid or liquid composition onto a workpiece. In one embodiment, the liquid or liquid composition is dispensed using a printing head or other similar structure and this may include, but is not limited to, ink jetting printing or continuous nozzle printing.

The term "proofing device" is intended to mean a structure to assist in the evaluation of a process or material for printing applications.

The term "substrate" is used to describe a surface in which printing liquid is placed after leaving a nozzle assembly.

The term "surface tension" refers to the cohesive forces in a liquid, as measured in dyne/cm. As the surface tension of liquids decreases, the liquids spread more readily over a surface.

The term "semiconductor" when referring to a material is intended to mean a material, which: (1) depending on impurity concentration(s) within the material, can be any of an insulator, a resistor, or a conductor; (2) when contacting a particular type of dissimilar material can form a rectifying junction; (3) is an active region of a transistor; or (4) any combination thereof.

Figure 7:
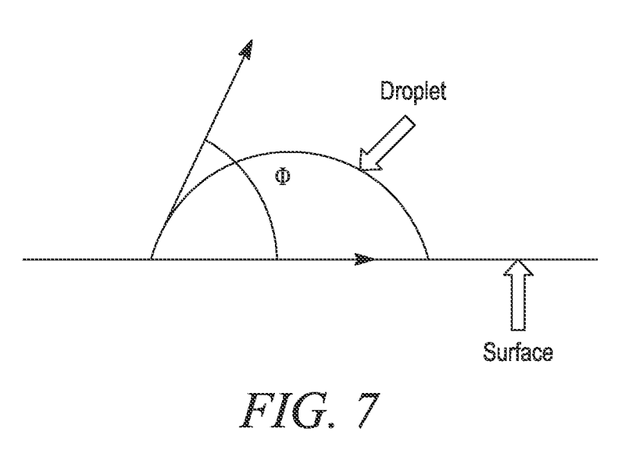
FIG. 7 represents contact angle between a surface and a liquid droplet.

The term "surface energy" is the energy required to create a unit area of a surface from a material. A characteristic of surface energy is that liquid materials with a given surface energy will not wet surfaces with a sufficiently lower surface energy. One way to determine the relative surface energies, is to compare the contact angle of a given liquid on layers of different materials. As used herein, the term "contact angle" is intended to mean the angle $\phi$ shown in FIG. 7. For a droplet of liquid medium, angle $\phi$ is defined by the intersection of the plane of the surface and a line from the outer edge of the droplet to the surface. Furthermore, angle $\phi$ is measured after the droplet has reached an equilibrium position on the surface after being applied, i.e. "static contact angle". A variety of manufacturers make equipment capable of measuring contact angles.

The term "surface energy containment pattern" or "surface tension containment pattern" is intended to mean using surface energy to prevent the spreading of something, to maintain something within a desired boundary.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic cell, and semiconductive member arts.

Description of Printing Apparatus

Throughout the following detailed description similar reference characters refers to similar elements in all figures of the drawings.

Figure 1:
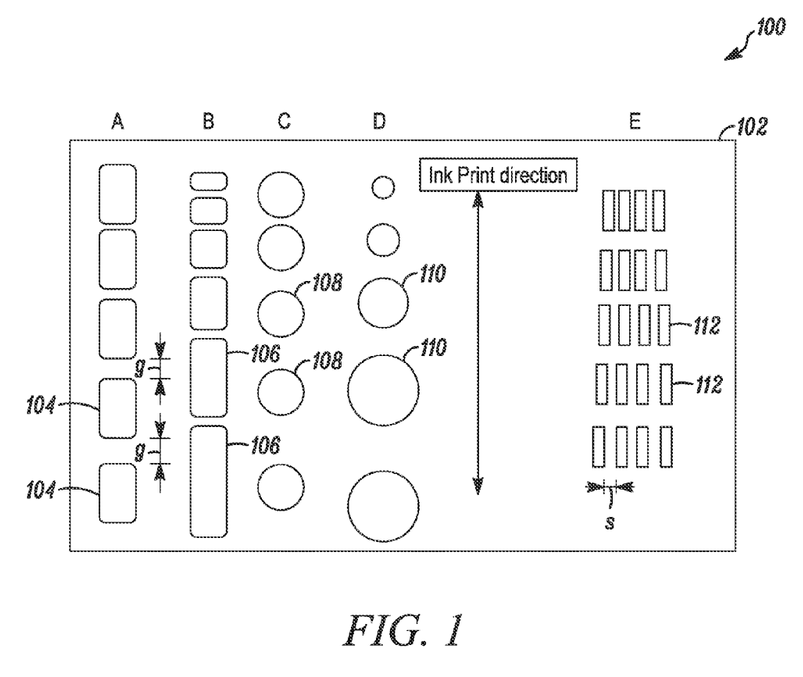
FIG. 1 represents an embodiment of the present invention with a top view of a proofing device with columns of geometric shapes.

FIG. 1 represents an embodiment of the present invention with a top view of a proofing device 100 having a substrate 102 containing geometric shapes 104, 106, 108, 110 and 112. Note the arrangement in columns, these columns aligning with the ink print direction shown, and these geometric shapes are alternately referred to as ink containment structures. Geometric shapes 104 arranged in a column A; geometric shapes 106 arranged in a column B; geometric shapes 108 arranged in a column C; geometric shapes 110 arranged in a column D; geometric shapes 112 arranged in a column E. Note, proofing device 100 is not limited to the number of columns shown, and can have more columns or less columns than those illustrated in FIG. 1.

Column A shows gradient in gap "g" between adjacent geometric shapes 104 when progressing through the plurality of the geometric shapes 104. These geometric shapes 104 illustrate a constant area with varying gaps "g" within column A, and are referred to as first geometric shapes 104 within first column A.

Column B shows a gradient of the area of geometric shapes 106 when progressing through the plurality of the geometric shapes 106, but constant gap "g" between adjacent geometric shapes 106.

Column C is similar to column A in that geometric shapes 108 have constant area but gradient in gap "g" between adjacent geometric shapes 108 when progressing through the plurality of the geometric shapes 108. In addition, geometric shapes 108 are circles, as opposed to the rectangles of geometric shapes 104 and 106.

Column D illustrates both a gradient of the area and gap "g" of geometric shapes 110 when progressing through the plurality of the geometric shapes 110.

Column E illustrates an arrangement where the geometric shapes 112 are arranged in column and row, with constant area and constant gap "g" but gradient in space "s" when progressing through the plurality of the geometric shapes 112.

Figure 2:
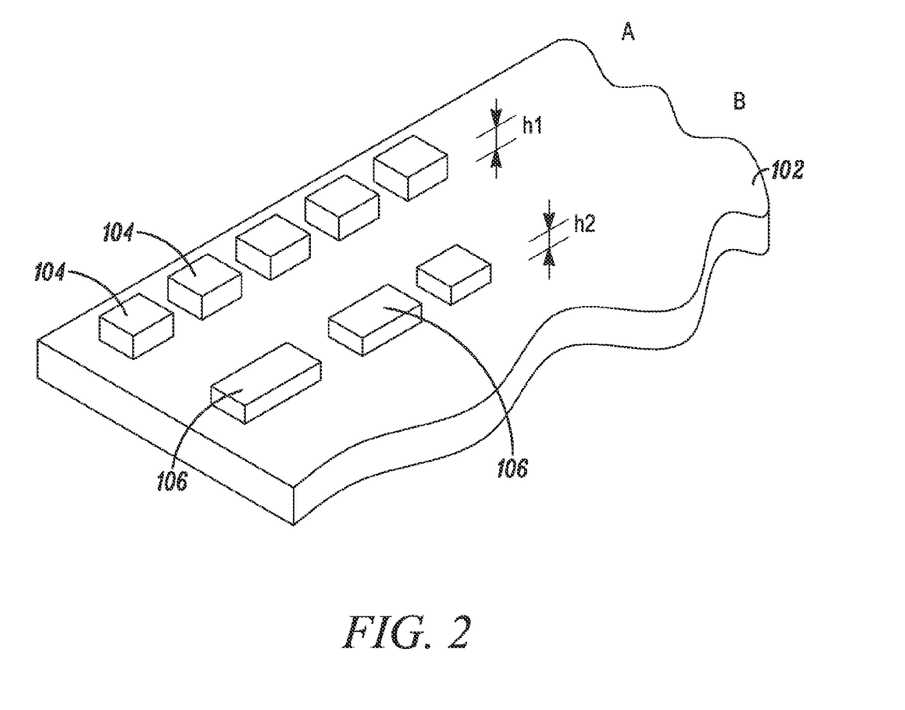
FIG. 2 represents an embodiment of the present invention with partial perspective view with a column of first geometric shapes having height h1 and a column of second geometric shapes having a height h2.

FIG. 2 represents an embodiment of the present invention with partial perspective view of the proofing device 100 of FIG. 1, with a column A of the first geometric shapes 104 having height h1 and a column B of the second geometric shapes having a height h2. Note h1 can be equal to h2, or in the alternative, h1 can be distinct from h2. The height of the geometric shapes is not particularly limited and can be anywhere from low to high values of nanometers (nm), millimeters (mm), or centimeters (cm). Note, each column can have an associated height of respective geometric shapes.

Figure 3:
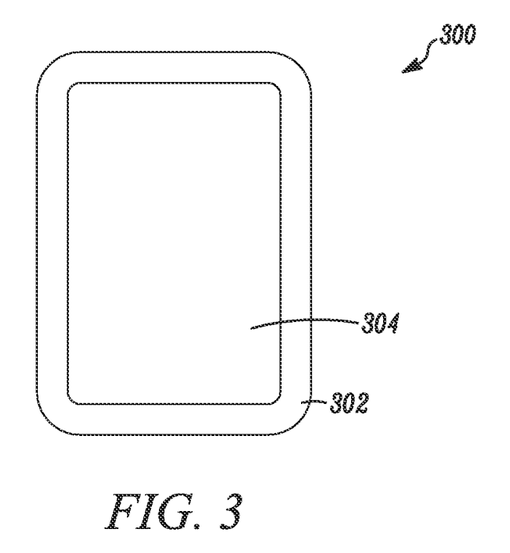
FIG. 3 represents an embodiment of the present invention with a top layer of a rectangular geometric shape having peripheral and interior areas.

FIG. 3 represents an embodiment of the present invention with a top layer 300 of a rectangular geometric shape having peripheral area 302 and an interior area 304. Note the peripheral area 302 is not required to have the same geometric shape as the interior area 304. For example, the peripheral area can be rectangular and the interior area can be elliptical (not shown). Other combinations can be drawn by those having ordinary skill in the art.

Figure 4:
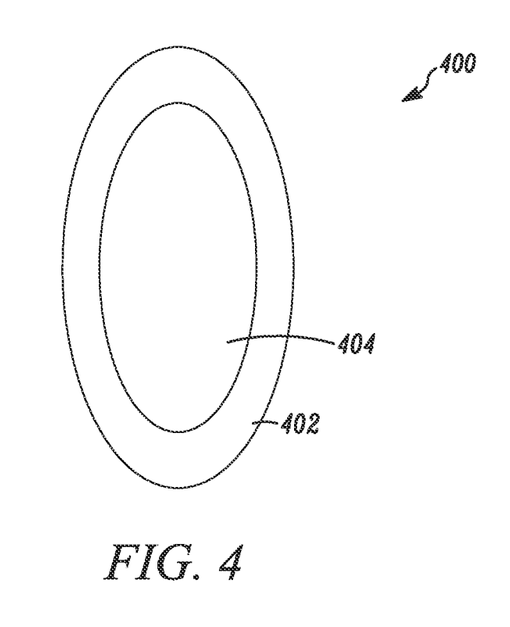
FIG. 4 represents an embodiment of the present invention with a top layer of an elliptical geometric shape having peripheral and interior areas.

FIG. 4 represents an embodiment of the present invention with a top layer 400 of an elliptical geometric shape having peripheral area 402 and an interior area 404. As stated in regard to FIG. 3, the peripheral area 402 is not required to have the same geometric shape as interior area 404. Other combinations can be drawn by those having ordinary skill in the art.

Figure 5:
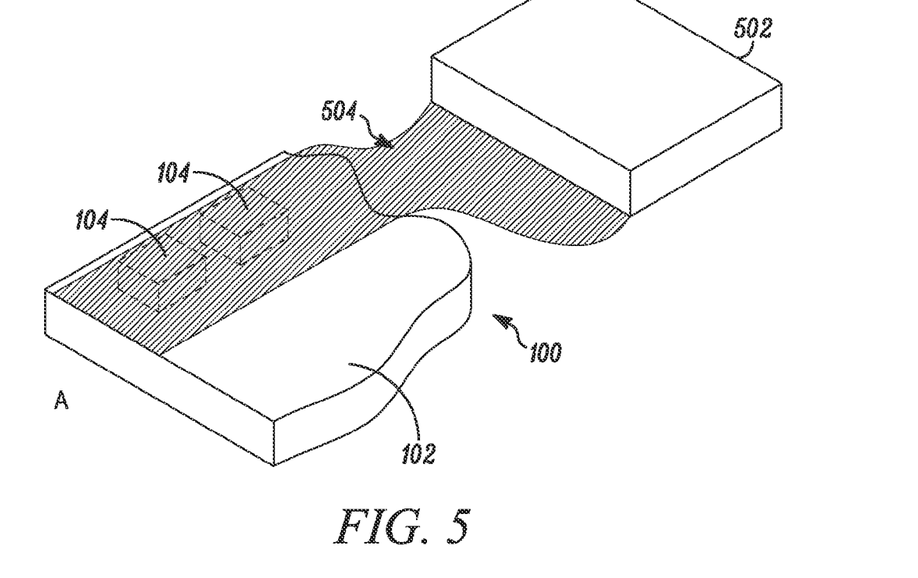
FIG. 5 represents an embodiment of the present invention with partial perspective view of a continuous ink deposition across geometric shapes.

FIG. 5 represents an embodiment of the present invention with partial perspective view of continuous ink deposition across geometric shapes. A continuous printer 502 deposits a continuous stream 504 of ink composition across geometric shapes 104 in column A. Exemplary continuous printers include slot-die coater or nozzle printers. Note the continuous stream 504 can cover any number of columns in a single pass (not shown), and is not limited to the single column as shown in FIG. 5.

Figure 6:
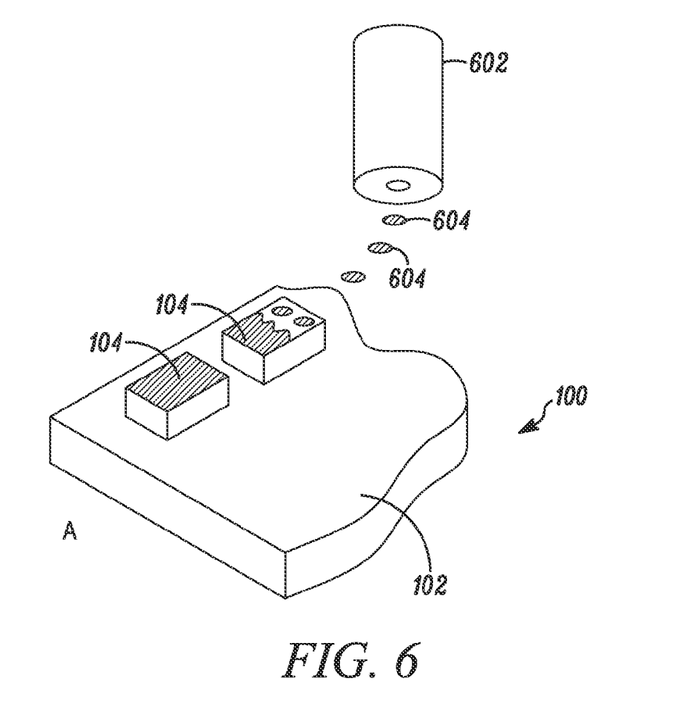
FIG. 6 represents an embodiment of the present invention with partial perspective view of a non-continuous ink deposition across geometric shapes.

FIG. 6 represents an embodiment of the present invention with partial perspective view of a non-continuous ink deposition across geometric shapes. A non-continuous printer 602 deposits a non-continuous stream 604 of ink composition across geometric shapes 104 in column A. Exemplary non-continuous printers include ink-jet printers. Note the non-continuous stream 604 can cover any number of columns in a single pass (not shown), and is not limited to the single column as shown in FIG. 6.

The interior and peripheral areas of the top layer of the geometric shapes can constitute a surface tension containment pattern, described later in this specification, this surface tension containment pattern can repel ink from peripheral areas and attract ink to interior areas. Surface energy differential between the interior area and the peripheral areas can be used to attract or repel ink, respectively, with a self-regulating mechanism as the interior area is only capable of attracting and holding a threshold level of ink defining a fully filled interior area.

When using continuous ink deposition, for example that shown in FIG. 5, the continuous stream 504 should "break" to form the fully filled interior areas. Thus, a fully filled interior area constitutes a successful wetting result, while a not filled or partially filled interior area constitutes a non-successful wetting result. When evaluating the proofing device 100 for successful wetting result in deposition of ink, the "break" should occur at 300 ms or less to attain the fully filled interior area. Each geometric shape within a column can be evaluated for successful wetting result in deposition of ink, accordingly by way of example, the five geometric shapes 104 of column A in FIG. 1 may contain any combination of successful or non-successful wetting results. And by extension, this evaluation extends to every geometric shape on the proofing device 100.

Description of Surface Tension Containment Pattern

One way to determine the relative surface energies, is to compare the contact angle of a given liquid on a layer. As used herein, the term "contact angle" is intended to mean the angle $\phi$ shown in FIG. 7. For a droplet of liquid medium, angle $\phi$ is defined by the intersection of the plane of the surface and a line from the outer edge of the droplet to the surface. Furthermore, angle $\phi$ is measured after the droplet has reached an equilibrium position on the surface after being applied, i.e. "static contact angle". A variety of manufacturers make equipment capable of measuring contact angles.

In at least one embodiment the surface tension containment pattern contains a first layer having a first surface energy. Treating this first layer with a priming layer, one example of the priming layer being an aromatic amine compound. Additives can be mixed into the priming layer prior to processing to achieve specific surface energies. The additives include surfactants, fluoro-surfactants, silicones, siloxanes, or other surface modifiers. The wetting characteristics of the photoresist/additive formulations are known or easily determined via routine experimentation. Exposing the primer layer patternwise with UV radiation having a wavelength greater than 100 nm, resulting in exposed areas and unexposed areas. In another embodiment exposing the primer layer with UV radiation having a wavelength between 100 nm and 400 nm. Developing the priming layer to effectively remove the priming layer from the unexposed areas resulting in a first layer having a patterned priming layer thereon. The patterned priming layer has a second surface energy that is higher than the first surface energy, and deposition of ink to form a second layer by liquid deposition on the patterned priming layer on the first layer.

In one embodiment, this surface containment pattern is designated interior area 304 in FIG. 3, and interior area 404 in FIG. 4. The surface energy of the peripheral area 302 or 402 is less than the surface energy of the priming layer in the interior area 304 or 404. When the continuous stream 504, or non-continuous stream 604, is deposited over the priming layer of interior area 304 or 404, and peripheral area 302 or 402, it does not wet the low energy surface of peripheral area 302 or 402 and remains only over the pattern of the priming layer in the interior area 304 or 404.

The liquid ink is chosen to have a surface energy that is greater than the surface energy of the primer patterned peripheral area, but approximately the same as or less than the surface energy of the untreated interior area. Thus, the liquid ink will wet the interior areas, but will be repelled from the peripheral areas.

Description of Electronic Device

Proofing devices and the printing methods described herein can be used to evaluate materials and compositions for production of organic electronic devices. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in such devices to provide the necessary colors. The printing method described herein is suitable for the printing of liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

To form the printing inks, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), keytones (cyclopentatone) and mixtures thereof. Suitable solvents for photoactive materials have been described in, for example, published PCT application WO 2007/145979.

The OLED device has a first electrical contact layer, which is an anode layer, and a second electrical contact layer, which is a cathode layer. An active layer is located between the anode layer and cathode layer. The active layer can comprise electrical, optical, electro-optical, or semi-electrical layers. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

It should be appreciated from the foregoing description that the presently claimed invention serves to provide a testing process and apparatus for rapid evaluation of materials used to OLED production. A continuous line of ink, from a liquid dispenser, onto a proofing device containing ink attracting areas and ink repelling areas provides data for wetting results. This testing can resultant in production backplanes having pixel areas exhibiting improved uniformity and quality, leading to improved performance of the electronic device produced from the printed and subsequently dried liquid.

Those skilled in the art, having the benefit of the teachings of the present invention, may impart modifications thereto. Such modifications are to be construed as lying within the scope of the present invention, as defined by the appended claims.

What is claimed is:

1. A proofing device comprising:
a substrate;
a plurality of first geometric shapes in column arrangement on the substrate, the plurality of first geometric shapes having gaps between adjacent geometric shapes in the plurality of first geometric shapes, the plurality of first geometric shapes having a height (h1) above the substrate;
a plurality of second geometric shapes in column arrangement on the substrate, the plurality of second geometric shapes having gaps between adjacent geometric shapes in the plurality of second geometric shapes, the plurality of second geometric shapes having a height (h2) above the substrate; and
a top layer on each of the plurality of first geometric shapes and the plurality of second geometric shapes,
wherein at least one of the gaps between adjacent geometric shapes in the plurality of first geometric shapes and the gaps between adjacent geometric shapes in the plurality of second geometric shapes increases in progressing through the plurality of the first geometric shapes or the plurality of second geometric shapes.

2. The proofing device of claim 1 wherein the top layer on each of the plurality of first geometric shapes or the top layer on each of the plurality of second geometric shapes increases in area in progressing through the plurality of the first geometric shapes or the plurality of second geometric shapes.

3. The proofing device of claim 1 wherein at least one of the top layer on each of the plurality of first geometric shapes and the top layer on the plurality of second geometric shapes comprises a peripheral area having a first surface energy and an interior area having a second surface energy, the first and second surface energy are distinct from one another.

4. The proofing device of claim 3 wherein the interior area on at least one of the top layer on each of the plurality of first geometric shapes and the top layer on each of the plurality of second geometric shapes comprises an organic material.

5. The proofing device of claim 4 wherein the organic material is a semiconductor primer.

6. The proofing device of claim 4 wherein the organic material is a hole transport material.

7. The proofing device of claim 4 wherein the organic material is an electroluminescent material.

8. The proofing device of claim 1 wherein the plurality of first geometric shapes and the plurality of second geometric shapes are selected from circles, ellipses, and rectangles.

9. The proofing device of claim 1 wherein (h1) is equal to (h2).

10. The proofing device of claim 1 wherein (h1) is different from (h2).

* * * * *